United States Patent [19]

Wada et al.

[11] Patent Number: 4,607,246

[45] Date of Patent: Aug. 19, 1986

[54] MALFUNCTION INDICATING METHOD FOR VEHICLE-MOUNTED DC GENERATOR

[75] Inventors: Hifumi Wada; Shinji Nishimura, both of Hyogo, Japan

[73] Assignee: Mitsubishi Denki Kabushiki Kaisha, Tokyo, Japan

[21] Appl. No.: 657,114

[22] Filed: Oct. 3, 1984

[30] Foreign Application Priority Data

Oct. 3, 1983[JP] Japan ................................ 58-186431

[51] Int. Cl.⁴ ........................... B60Q 1/00; H02P 9/00
[52] U.S. Cl. .................................. 340/52 F; 340/636; 340/650; 320/64; 322/25; 322/99
[58] Field of Search .................... 340/52 F, 635, 650, 340/653, 636, 657, 660–663, 52 R; 322/99, 68, 25; 320/61, 68, 64

[56] References Cited

U.S. PATENT DOCUMENTS

| 4,316,134 | 2/1982 | Balan et al. | 322/99 |
| 4,348,629 | 9/1982 | Stevers | 322/99 |
| 4,360,772 | 11/1982 | Voss | 322/99 |

Primary Examiner—Donnie L. Crosland
Attorney, Agent, or Firm—Sughrue, Mion, Zinn, Macpeak & Seas

[57] ABSTRACT

Various malfunctions of a DC generator equipped with a voltage regulator and malfunction indicator are indicated distinguishably by detecting terminal voltages of a field winding and an armature winding of the DC generator and supplying a signal to the malfunction indicator, the signal being variable according to the type of malfunction. For example, the lighting interval of an indicator lamp is varied in accordance with the type of malfunction.

4 Claims, 4 Drawing Figures

MALFUNCTION INDICATING METHOD FOR VEHICLE-MOUNTED DC GENERATOR

BACKGROUND OF THE INVENTION

The present invention relates to a method for indicating malfunctions of a DC generator driven by an engine or the like.

FIG. 1 shows an example of a conventional malfunction indicating circuit for a vehicle-mounted DC generator. In FIG. 1, a DC generator 1 feeds a battery 2 and an electrical load 3 of vehicle. A switch 4, which may be a key switch of the engine, is connected in series with a charge lamp 5 used to indicate malfunctions of the DC generator 1. Also connected in series with the charge lamp 5 is a circuit breaker 6. A voltage regulator 7, connected to a field winding 8, functions to maintain constant the output voltage of the DC generator 1 by regulating the field current flowing through the field winding 8.

In operation, when the key switch 4 is turned on, the charge lamp 5 is lit by a current through the circuit breaker 6 which is held in an on state. Then, when the engine is started and the DC generator 1 is rotated, the circuit breaker 6 is turned on and the charge lamp 5 is extinguished, indicating normal operation of the DC generator 1.

When the DC generator 1 does not provide an output for some reason, the circuit breaker 6 is held in the on state and the charge lamp 5 is lit, by which an abnormality of the DC generator 1 is indicated. Also, when the voltage regulator 7 does not function correctly, for example, when the regulator 7 is maintained in the on state continuously for some reason providing no voltage regulation, the circuit breaker 6 continues to be in the on state and the charge lamp 5 is lit. This also indicates an abnormality of the DC generator 1 including the voltage regulator 7.

In such a conventional method of indicating malfunctions of the DC generator, it is impossible to know from the charge lamp whether the indicated malfunction is in the DC generator or the voltage regulator. It is, however, important to ascertain the point of the failure since a malfunction of the DC generator 1 makes it dangerous to continue to drive the vehicle because the battery is running down, which will eventually stall the engine and make it impossible to re-start the engine after the battery has been discharged to a certain level.

SUMMARY OF THE INVENTION

An object of the present invention is thus to provide a method for indicating malfunctions of a DC generator system whereby a distinction can be made between malfunctions of the DC generator itself and those of the voltage regulator.

The above object and other objects of the present invention are achieved by a method for indicating malfunctions of a DC generator system whereby terminal voltages of a field coil and an armature winding of the DC generator are detected and processed with a microcomputer to provide an indication indicative of the kind of malfunction.

DESCRIPTION OF THE PREFERRED EMBODIMENTS

Figure 1:
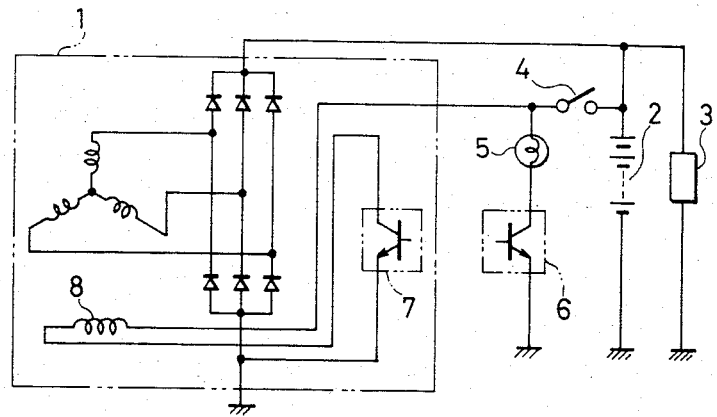
FIG. 1 is a circuit diagram of a conventional malfunction indicating device.
Figure 2:
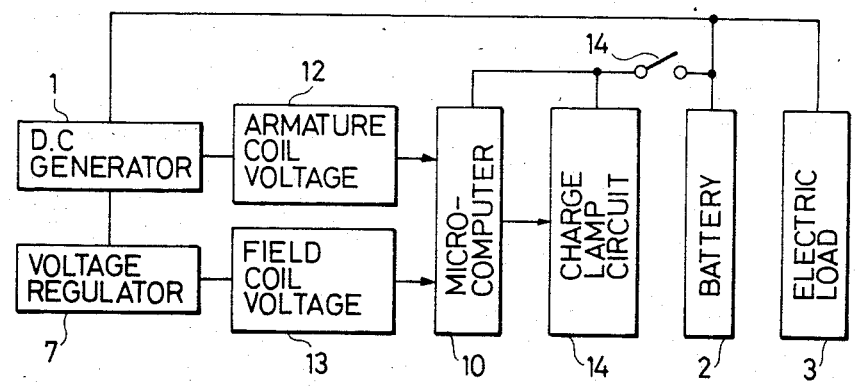
FIG. 2 is a block diagram of a device for practicing a method of the present invention.

In FIG. 2, a malfunction indicating device for practicing the method of the present invention includes, in addition to the elements of the conventional device shown in FIG. 1, an armature winding voltage detector 12, a field winding voltage detector 13, and a controller 10. In FIG. 2, reference numeral 14 indicates a charge lamp circuit composed of a series circuit of the charge lamp 5 and the circuit breaker 6 as shown in FIG. 1.

Figure 3:
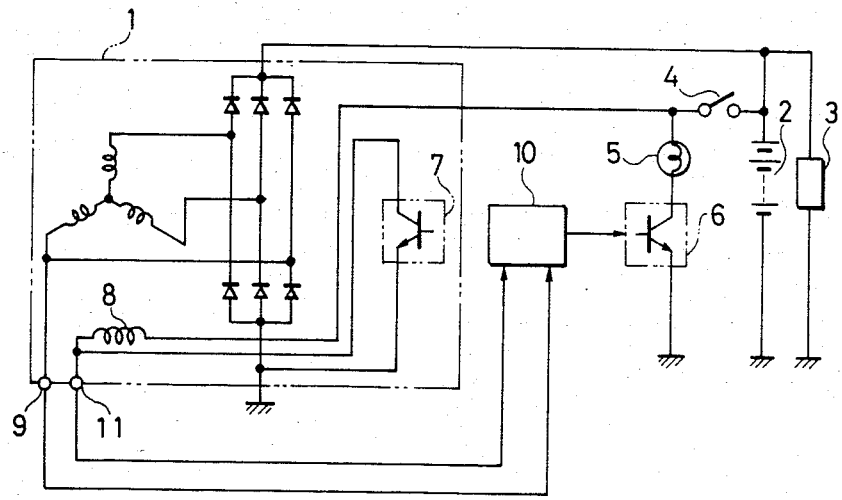
FIG. 3 is a circuit diagram of the device of FIG. 2.
Figure 4:
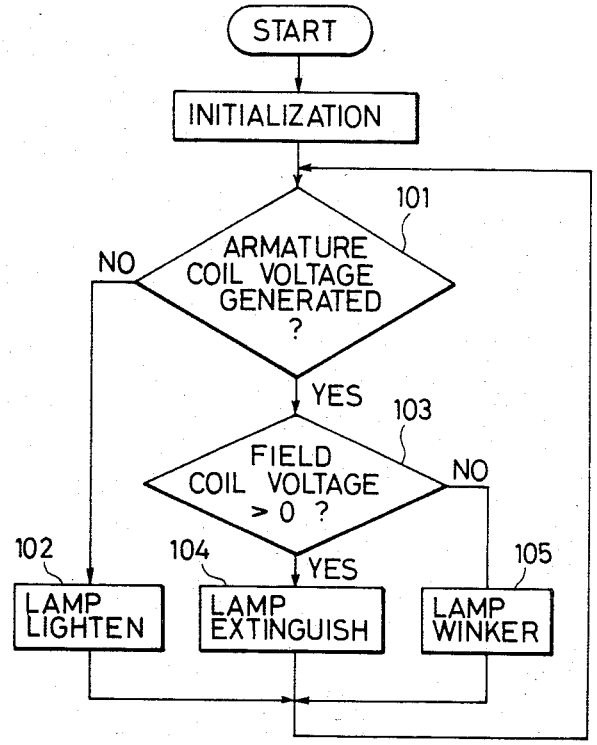
FIG. 4 is a flowchart showing operations of a microcomputer used in the embodiment in FIG. 3.

FIG. 3 is a circuit diagram showing the malfunction indicating device in FIG. 2, and FIG. 4 is a flowchart indicating the operations performed by the controller 10.

In FIGS. 2, 3 and 4, a phase voltage is detected at a terminal 9 of the armature coil 8 of the DC generator 1 and the detected phase voltage signal is supplied to the controller 10. A field coil voltage at a terminal 11 of the field coil 8 connected to the voltage regulator 7 is also supplied to the controller 10. The controller 10 is constituted by a microcomputer which supplies an output to the cirucit breaker 6 in response to the signals supplied thereto from the terminals 9 and 11.

In operation, when the key switch 4 is turned on, power is supplied to the controller 10 and the microcomputer is initialized. Then, a determination of whether a voltage is present at the armature coil terminal 9 is performed by the microcomputer 10 in a step 101 shown in FIG. 4.

When the engine (not shown) is not rotating, the DC generator 1 is not actuated, and thus there is no voltage produced at the armature coil terminal 9. In this case, the operation of the microcomputer 10 moves to a step 102 to light the charge lamp 5.

Then, when the engine is started and a voltage is produced at the armature coil terminal 9 of the DC generator 1, the operation of the microcomputer 10 is shifted to a step 103 in which it is determined whether a field coil voltage is present at the terminal 11 of the field coil 8.

When the voltage regulator 7 is operating normally, since it includes a transistor in its output circuit as shown in FIG. 3, a voltage drop corresponding to a collector-emitter saturation voltage $V_{CE}(SAT)$ of the transistor is present. Therefore, a voltage is detected at the terminal 11 so long as the voltage regulator 7 continues to operate normally.

When the field coil voltage is detected, the operation of the microcomputer 10 is shifted to a step 104. In the step 104, the charge lamp 5 is extinguished, indicating normal operation of the DC generator 1 and the voltage regulator 7.

When the voltage regulator 7 malfunctions, for instance, due to a short circuit of the transistor controlling the field current flow, the field coil terminal 11 is grounded. In such a case, no field coil voltage is detected. Thus, the operation of the microcomputer 10 is shifted to a step 105 in which the charge lamp 5 is lit intermittently, indicating a malfunction of the voltage regulator 7.

Thus, according to the malfunction indicating method of the present invention, it is possible to separately indicate malfunctions of the DC generator and malfunctions of the voltage regulator.

Although, in the above embodiment, the detection and indication of only those malfunctions where the DC generator produces no voltage or where the voltage regulator provides no voltage regulation are described, it should be noted that other malfunctions such as the disconnection of the output wiring of the DC generator may be indicated according to the present method by, for example establishing a different repetition rate for the charge lamp.

Further, it should be noted that other signalling elements such as a buzzer, etc., may be used instead of the charge lamp.

We claim:

1. A malfunction indicating method for indicating various malfunctions of a DC generator in a distinguishable manner, comprising; providing a malfunction indicator of a type capable of operating in either a continuous or intermittent mode; providing a controller for actuating said indicator in one of said intermittent and continuous modes; detecting an armature terminal voltage of said DC generator by directly connecting one armature terminal of said generator to an input of said controller; detecting a field winding terminal voltage of said DC generator by directly connecting a field winding terminal to said controller, with said field winding terminal being electrically isolated from said armature terminal; determining the type of malfunction on the basis of said voltage detecting steps; and selectively operating said indicator in one of said continuous and intermittent modes in response to said determination.

2. The malfunction indicating method as claimed in claim 1, wherein said indicator comprises an indicator lamp.

3. The malfunction indicating method as claimed in claim 1, wherein said indicator comprises a buzzer.

4. A malfunction detection and indication system, for a DC generator, comprising; a malfunction indicator capable of operating in both continuous and intermittent modes, control means for distinguishing plural types of generator malfunctions, said control means including at least two detection inputs, an armature terminal coupled to a first one of said detection inputs, said armature terminal being directly connected to one winding of an armature of said DC generator, a field winding terminal connected to another of said detection inputs, said field winding terminal being directly connected to one end of a field winding of said DC generator, said field winding terminal being electrically isolated from said armature terminal, said control means controlling actuation of said indicator in one of said continuous and intermittent modes in response to a determination of the type of generator malfunction.

* * * * *